(12) United States Patent
Kim

(10) Patent No.: US 7,679,918 B2
(45) Date of Patent: Mar. 16, 2010

(54) LED ELEMENT AND PRINTED CIRCUIT BOARD WITH THE SAME

(75) Inventor: Jongdae Kim, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/126,367

(22) Filed: May 23, 2008

(65) Prior Publication Data

US 2009/0086438 A1    Apr. 2, 2009

(30) Foreign Application Priority Data

Sep. 27, 2007    (CN) .................... 2007 1 0122585

(51) Int. Cl.
*H05K 7/20* (2006.01)
*F21V 29/00* (2006.01)

(52) U.S. Cl. .............. 361/719; 361/704; 361/707; 361/717; 361/720; 165/80.2; 165/80.3; 165/104.33; 165/185; 362/218; 362/294; 362/373; 257/88; 257/99; 257/706; 257/707; 257/711

(58) Field of Classification Search ............. 361/679.46, 361/679.54, 679.59, 702–712, 717, 715, 361/719, 720–722; 165/80.2, 80.3, 80.4, 165/80.5, 104.33, 185; 257/88, 99, 675, 257/676, 706–727; 362/227, 218, 294, 373, 362/800, 547, 555, 249, 548; 313/11, 32, 313/30, 498; 174/15.1, 16.3, 252

See application file for complete search history.

(56) References Cited

U.S. PATENT DOCUMENTS

| | | | | |
|---|---|---|---|---|
| 6,428,189 | B1 * | 8/2002 | Hochstein | 362/373 |
| 6,498,355 | B1 * | 12/2002 | Harrah et al. | 257/99 |
| 6,517,218 | B2 * | 2/2003 | Hochstein | 362/294 |
| 6,582,100 | B1 * | 6/2003 | Hochstein et al. | 362/294 |
| 6,920,046 | B2 * | 7/2005 | Spryshak | 361/704 |
| 6,999,318 | B2 * | 2/2006 | Newby | 361/719 |
| 7,119,422 | B2 * | 10/2006 | Chin | 257/666 |
| 7,121,680 | B2 * | 10/2006 | Galli | 362/202 |
| 7,218,041 | B2 * | 5/2007 | Isoda | 313/11 |
| 7,285,802 | B2 * | 10/2007 | Ouderkirk et al. | 257/98 |
| 2006/0250270 | A1 * | 11/2006 | Tangen | 340/815.45 |
| 2007/0268703 | A1 * | 11/2007 | Gasquet et al. | 362/294 |

FOREIGN PATENT DOCUMENTS

| | | |
|---|---|---|
| CN | 2665920 Y | 12/2004 |
| CN | 1741291 A | 3/2006 |

* cited by examiner

*Primary Examiner*—Michael V Datskovskiy
(74) *Attorney, Agent, or Firm*—Ladas & Parry LLP

(57) ABSTRACT

Disclosed is a printed circuit board (PCB) comprising at least one light emitting diode (LED) element and a PCB body. The LED comprises a heat sink, a light emitting body and two base feet, each base foot comprising a support portion for supporting the light emitting body, an engaging portion and a connecting portion for connecting the support portion to the engaging portion, and the heat sink is disposed under the support portion. The PCB body comprises a first recess portion for disposing the heat sink to increase heat dissipation of the heat sink and two second recess portions for receiving the engaging portions of the base feet to increase heat dissipation of the base feet.

11 Claims, 5 Drawing Sheets

LED ELEMENT AND PRINTED CIRCUIT BOARD WITH THE SAME

BACKGROUND OF THE INVENTION

The invention relates to a light emitting diode (LED) element and a printed circuit board (PCB) with the light emitting diode (LED) element.

A LED element typically comprises a light emitting body and two base feet for conducting current. FIG. 1a is a schematic view showing a conventional LED element. As shown in FIG. 1a, the LED element comprises a light emitting body 2 and two base feet 1 disposed below the light emitting body 2 on both sides for conducting current, respectively. Each base foot 1 comprises a support portion 101 supporting the light emitting body 2 and a connecting portion 102 for coupling to a power source. A heat sink 3 is disposed under the light emitting body 2. A bottom surface of the heat sink 3 is coplanar with a bottom surface of the connecting portion 102 so that the heat sink 3 can contact with a surface of a printed circuit board (PCB) body when the LED element is mounted onto the PCB body. FIG. 1b is a schematic view showing a PCB body with LED elements disposed thereon. The PCB body used here is typically made of aluminum based material and only electrodes are disposed on the surface of the PCB body for connecting to the base feet.

SUMMARY OF THE INVENTION

In an aspect of embodiment of the invention, there is provided a PCB with a LED element for improving heat dissipation of the LED element and mounting precision of the LED element in the mounting process of the LED element.

In an embodiment of the invention, there is provided a printed circuit board (PCB) comprises at least one light emitting diode (LED) element and a PCB body. Each LED element comprises a heat sink, a light emitting body, and two base feet. Each base foot comprising a support portion for supporting the light emitting body, an engaging portion and a connecting portion for connecting the support portion to the engaging portion. The heat sink is disposed under the support portion. The PCB body comprises a first recess portion for disposing the heat sink to increase heat dissipation of the heat sink and two second recess portions for receiving the engaging portions of the base feet to increase heat dissipation of the base feet.

Preferably, a height of the heat sink may be larger than a height of a connecting portion and the bottom surface of the heat sink may be coplanar with a surface of the PCB body on which the LED element is mounted. The first recess portion may be a through hole or a blind hole. The second recess portion may be a through hole or a blind hole.

Preferably, the PCB can further comprise two heat dissipation feet and two third recess portions on the PCB body. Each heat dissipation foot comprises a support portion for supporting the light emitting body, an engaging portion and a connecting portion for connecting the support portion to the engaging portion. The third recess portions are used for receiving the engaging portions of the heat dissipation feet to increase heat dissipation of the heat dissipation feet. The third recess portion may be a through hole or a blind hole.

In another embodiment of the invention, there is provided a PCB comprising at least one LED element and a PCB body. Each LED element comprises a heat sink, a light emitting body, and at least one foot comprising a support portion for supporting the light emitting body, an engaging portion, and a connecting portion for connecting the support portion to the engaging portion. The heat sink is disposed under the support portion. The PCB body comprises a first recess portion for disposing the heat sink to increase heat dissipation of the heat sink and at least one second recess portion for receiving the engaging portion of the at least one foot to increase heat dissipation of the at least one foot.

In yet another embodiment of the invention, there is provided a light emitting diode (LED) element comprising a heat sink, a light emitting body; and at least one foot comprising a support portion for supporting the light emitting body, an engaging portion and a connecting portion for connecting the support portion to the engaging portion. The heat sink is disposed under the support portion.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The invention will become more fully understood from the detailed description given hereinafter and the accompanying drawings which are given by way of illustration only, and thus are not limitative of the invention and wherein:

FIG. 2b is a cross section view taken along line II-II of FIG. 2a;

FIG. 3b is a cross section view taken along line III-III of FIG. 3a;

FIG. 5b is a cross section view taken along line V-V of FIG. 5a;

DETAILED DESCRIPTION OF THE PREFERRED EMBODIMENTS

In an embodiment of the invention, there is provided a PCB comprising a LED element and a PCB body. The LED element comprises a heat sink, a light emitting body, and two base feet. Each base foot comprises an engaging portion. The PCB body comprises a first recess portion for disposing the heat sink to increase heat dissipation area of the heat sink and a second recess portion for receiving the engaging portion to increase heat dissipation area of the base feet.

The First Embodiment

Figure 1A:
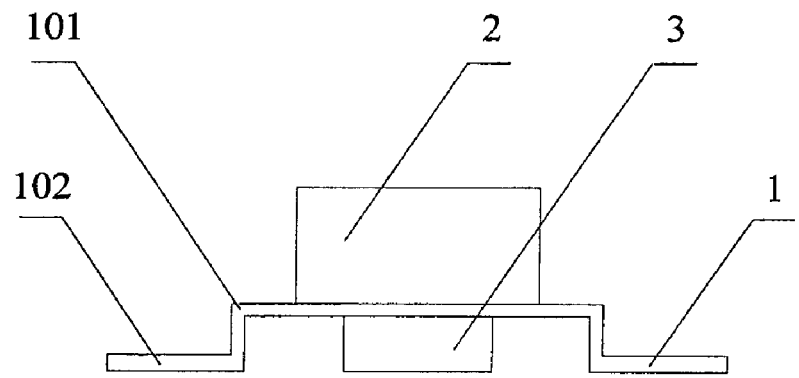
FIG. 1a is a schematic view showing a conventional LED element.
Figure 1B:
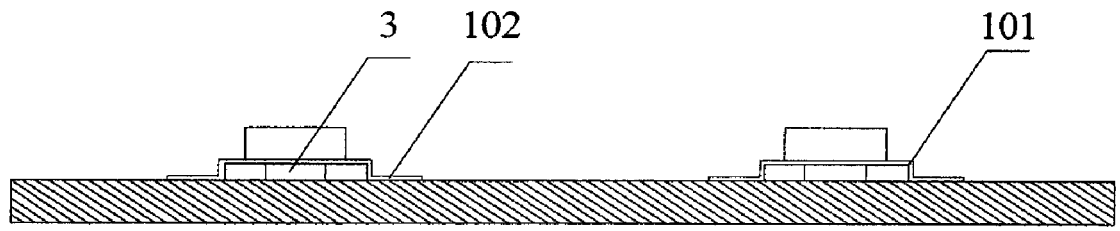
FIG. 1b is a schematic view showing a conventional PCB with LED elements.
Figure 2A:
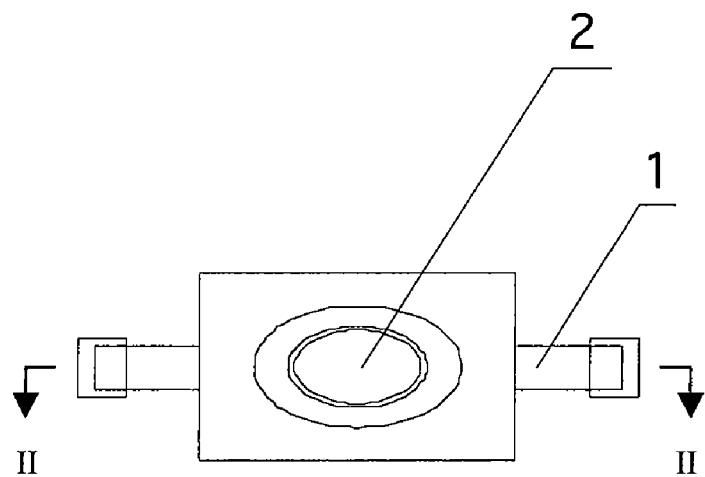
FIG. 2a is a schematic view showing a LED element according to a first embodiment of the invention.
Figure 2B:
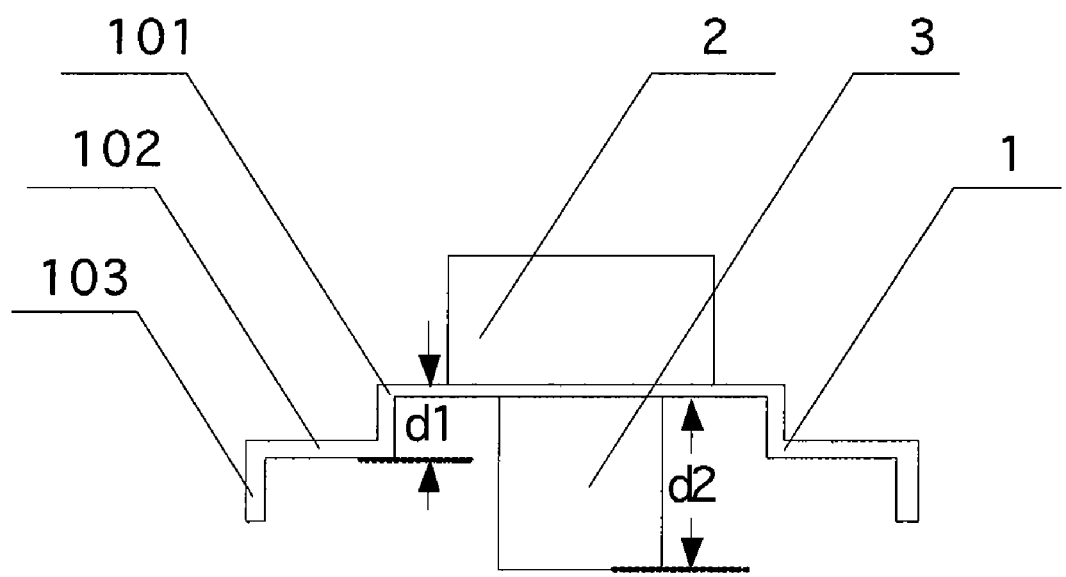
Figure 3A:
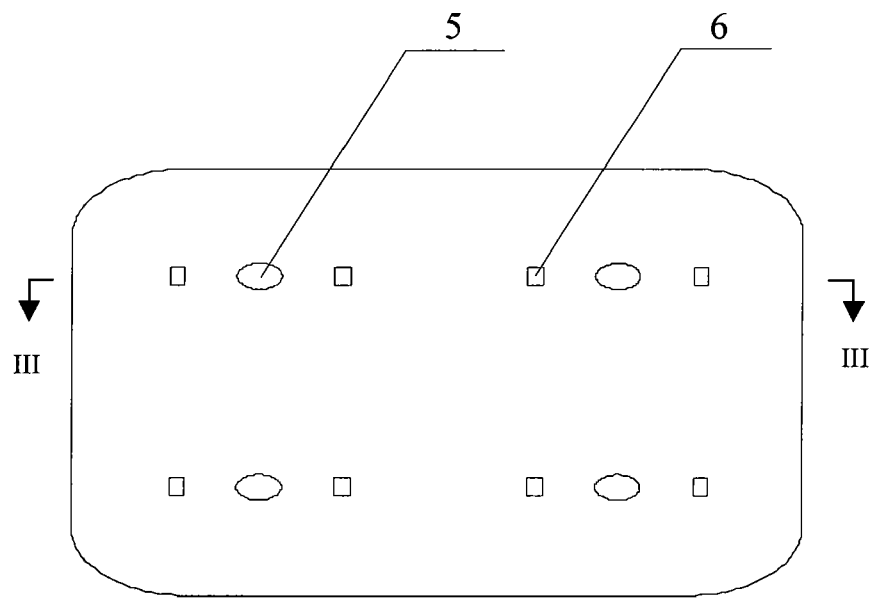
FIG. 3a is a schematic view showing a PCB body according to a first embodiment of the invention.
Figure 3B:
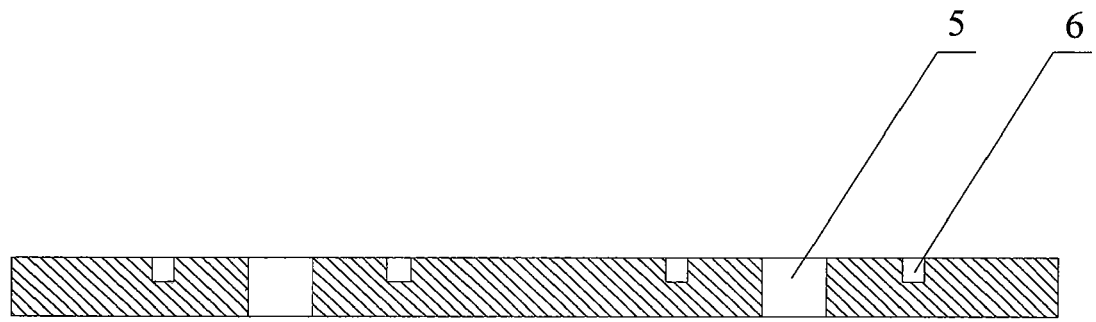
Figure 4:
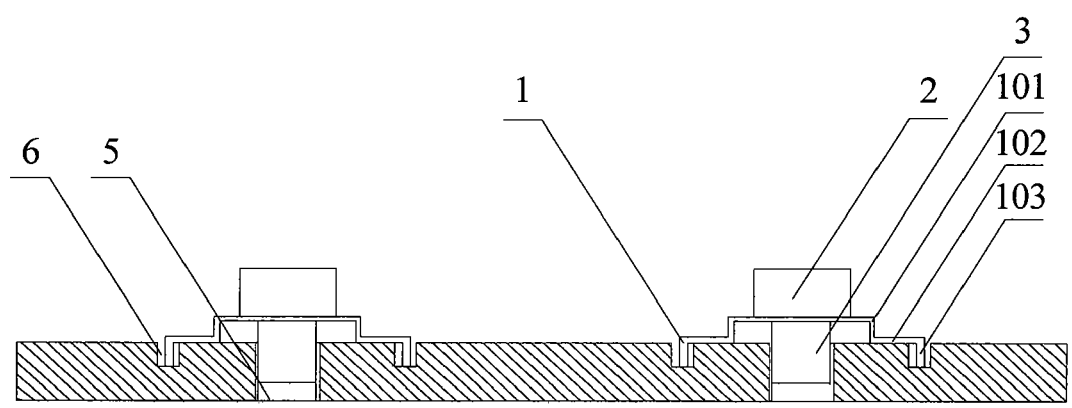
FIG. 4 is a schematic view showing a PCB with the LED elements according to the first embodiment of the invention.

FIG. 2a is a schematic view showing a LED element according to a first embodiment of the invention. FIG. 2b is a cross section view taken along line II-II of FIG. 2a. FIG. 3a is a schematic view showing a PCB body according to a first embodiment of the invention. FIG. 3b is a cross section view taken along line III-III of FIG. 3a. FIG. 4 is a schematic view showing a PCB with the LED elements according to the first embodiment of the invention. As shown in FIGS. 2a-4, the LED element according to the first embodiment of the invention comprises a light emitting body 2, two base feet 1, and a heat sink body 3. Each base foot 1 comprises a support portion 101, a connecting portion 102, and an engaging portion 103. The support portion 101 is electrically connected to the light emitting body 2. Both ends of the support portion 101 extend downward to be connected to one end of the connecting portions 102 on both side of the support portion 101, respectively. The other end of the connecting portion 102 in turn extends downward to form an engaging portion 103. The base feet 1 disposed below the light emitting body 2 are used for coupling to the positive and negative electrode of a power source to conduct a current into the light emitting body 2. The heat sink 3 is disposed right under the light emitting body with a height d2 larger than a height d1 of the support portion 101, as shown in FIG. 2b. Further, the heat sink 3 is disposed under the support portion 101. For each LED element, there is one first recess portion 5 for receiving the heat sink 3 and two second recess portions 6 for receiving two engaging portions 103 of the LED element on the surface of the PCB body, as shown in FIG. 3a. The first recess portion 5 is used for receiving the heat sink when the LED element is mounted on the PCB body. The second recess portions 6 can secure the engaging portions 103 of the LED element to the PCB body during the mounting process. The PCB body used here can be made of aluminum based material and the like, and electrodes may be disposed on the surface of the PCB body for connecting to the base feet or other components.

According to the embodiment of the invention, the heat dissipation from the LED element to the PCB body is increased by adding the engaging portion of the base feet and increasing the height of the heat sink, since the heat generated in the LED element can be dissipated more quickly to the environment through the base feet and the heat sink. Thus the stability and the service life of the LED element can be improved.

Furthermore, during the mounting process of the LED element, the engaging portion 103 instead of the connecting portion in a conventional LED element serves as an coupling member between the LED element and the PCB body, and therefore the distance between the engaging member on which a thermal bonding process is performed and the light emitting body 2 is increased, thus reducing an adverse effect on the LED element due to the heat generated in the bonding process, such us a soldering process, performed at the engaging member and avoiding damages to the LED element.

According to the embodiment of the invention, the heat dissipation from the LED element to the PCB body can be improved by providing one first recess portion and two second recess portions on the PCB body for the LED element, since the heat generated in the LED element can be dissipated more quickly to the environment through the base feet in contact with the second recess portions and the heat sink in contact with the first recess portion with added heat dissipation area. Thus the stability and the service life of a LED element mounted on the PCB body can be improved.

In addition, the first portion 5 and the second portions 6 can serve as positioning means in the mounting process of the LED element, thus improving the mounting precision even with a manual mounting process and providing mounting reference marks which can enable an automated mounting process.

The first recess portion 5 can be either a through hole or a blind hole; the second recess portions 6 can be either through holes or blind holes. In a case that both the first and the second recess portions are through holes, the heat dissipation can be maximized in a similar manner discussed above.

The Second Embodiment

Figure 5A:
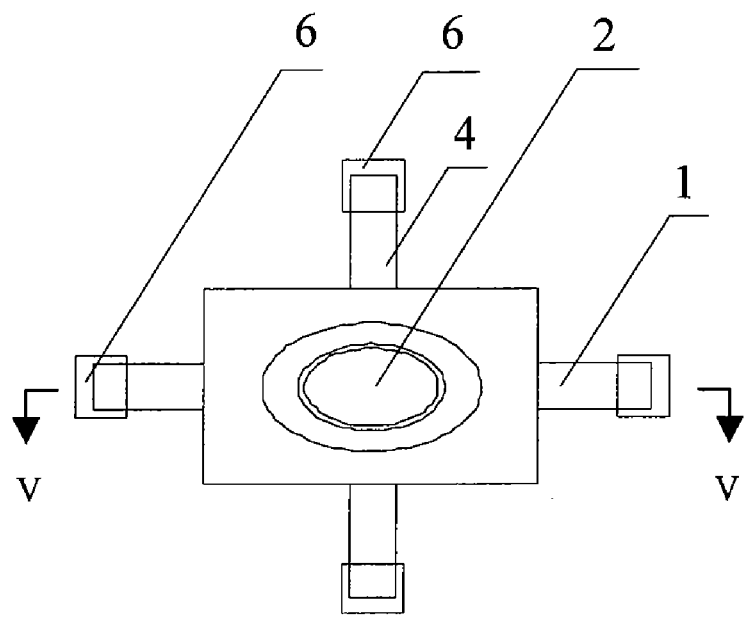
FIG. 5a is a schematic view showing a LED element according to a second embodiment of the invention.
Figure 5B:
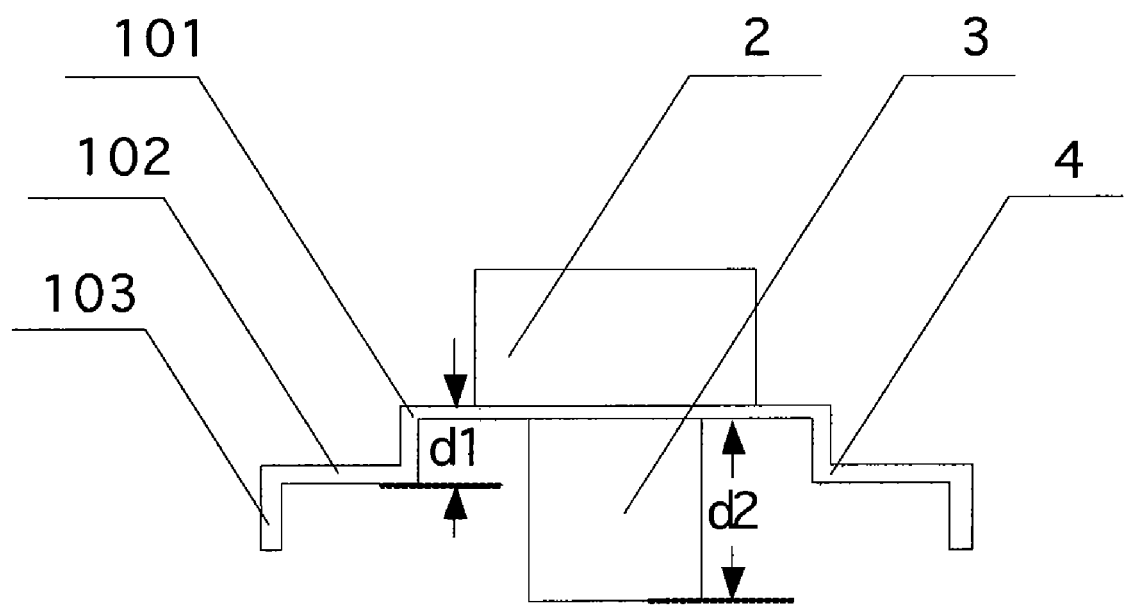
Figure 6:
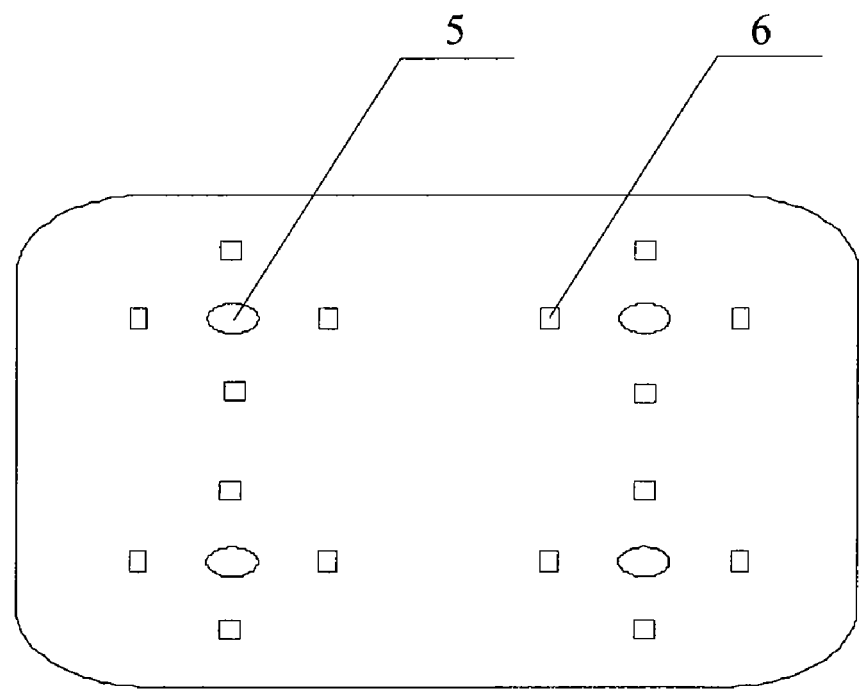
FIG. 6 is a schematic view showing a PCB body according to a second embodiment of the invention.
Figure 7:
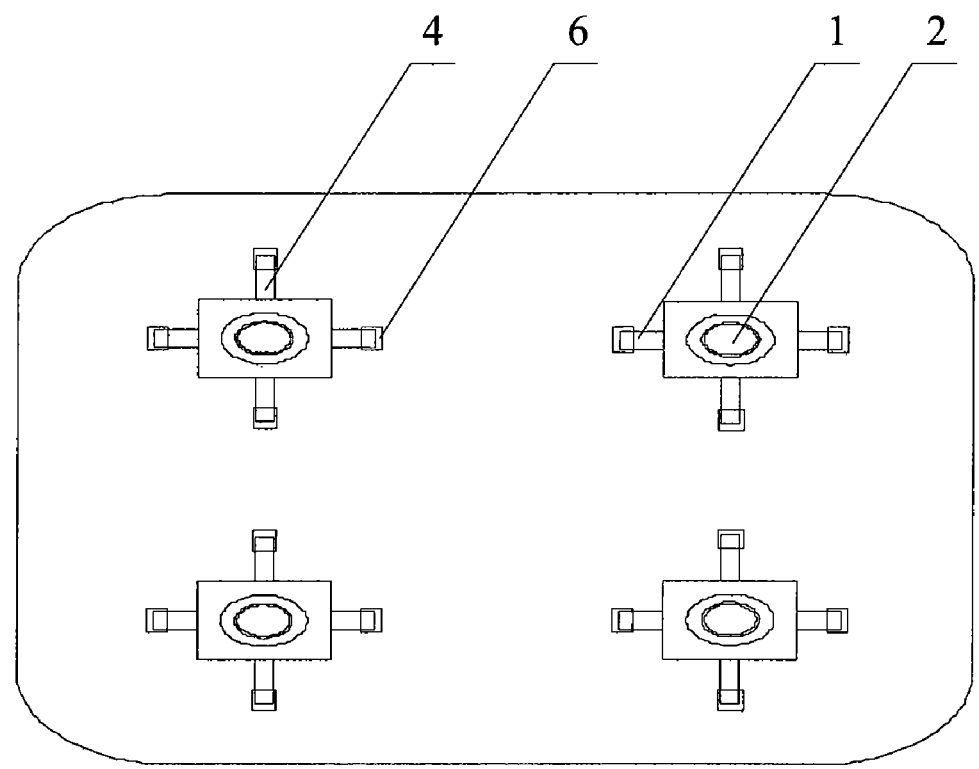
FIG. 7 is a schematic view showing a PCB with LED elements according to the second embodiment of the invention.

FIG. 5a is a schematic view showing a LED element according to a second embodiment of the invention. FIG. 5b is a cross section view taken along line V-V of FIG. 5a. FIG. 6 is a schematic view showing a PCB body according to a second embodiment of the invention. FIG. 7 is a schematic view showing a PCB with the LED elements according to the second embodiment of the invention. As shown in FIGS. 5a-7, the LED element according to the first embodiment of the invention comprise a light emitting body 2, two base feet 1, two heat dissipation feet 4, and a heat sink body 3. Each base foot 1 comprises a support portion 101, a connecting portion 102 and an engaging portion 103. Each heat dissipation foot 4 comprises a support portion 101, a connecting portion 102, and an engaging portion 103. The support portion 101 is electrically connected to the light emitting body 2. Both ends of the support portion 101 extend downward to be connected to one end of the connecting portions 102 on both side of the support portion 101, respectively. The other end of the connecting portion 102 in turn extends downward to form an engaging portion 103. Two base feet 1 are disposed opposing each other and two heat dissipation feet 4 are disposed opposing each other with the alignment direction of the base feet 1 perpendicular to the alignment direction of the heat dissipation feet. The base feet 1 are used for coupling to the positive and negative electrode of a power source to conduct a current into the light emitting body 2. The heat sink 3 is disposed right under the light emitting body with a height d2 larger than a height d1 of the support portion 101, as shown in 5b. Further, the heat sink 3 is disposed under the support portion 101. For each LED element, there is one first recess portion 5 for receiving the heat sink 3 and four second recess portions 6 for receiving two engaging portions 103 of the two base feet 1 and two engaging portions 103 of two heat dissipation feet 4 of the LED element on the surface of the PCB body. The first recess portion 5 is used to receive the heat sink 3 when the LED element is mounted on the PCB body. The second recess portions 6 can secure the engaging portion 103 of the LED element to the PCB body during the mounting process. The first recess portion 5 and the second recess portions 6 can be either a through hole or a blind hole.

According to the second embodiment of the invention, the heat dissipation from the LED element to the PCB body can be further improved by adding two more heat dissipation feet, thus the stability and the service life of a LED element can be further improved compared with the first embodiment of the invention. In addition, two dissipation feet 4 can also serve as alternative bonding members for mounting the LED element to enhance the replaceability of the LED element.

According to the embodiment of the invention, the heat dissipation from the LED element to the PCB body can be further improved by adding two more second recess portions on the PCB body, since the heat generated in the LED element can be dissipated more quickly to the environment through the heat dissipation feet in contact with the second recess portions. Thus the stability and the service life of a LED element mounted on the PCB body can be in turn improved compared with the first embodiment. In addition, two second recess portions for receiving the dissipation feet 4 can also serve as alternative bonding members for mounting the LED element to enhance the replaceability of the LED element.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A printed circuit board (PCB) comprising:
   at least one light emitting diode (LED) element comprising a heat sink, a light emitting body, and two base feet, each base foot comprising a support portion for supporting the light emitting body, an engaging portion, and a connecting portion for connecting the support portion to the engaging portion, wherein the heat sink is disposed under the support portion; and
   a PCB body comprising a first recess portion for disposing the heat sink to increase heat dissipation of the heat sink and two second recess portions for receiving the engaging portions of the base feet to increase heat dissipation of the base feet.

2. The PCB according to claim 1, wherein a height of the heat sink is larger than a height of a connecting portion and the bottom surface of the heat sink is coplanar with a surface of the PCB body on which the LED element is mounted.

3. The PCB according to claim 1, wherein the first recess portion is a through hole or a blind hole.

4. The PCB according to claim 1, wherein the second recess portion is a through hole or a blind hole.

5. The PCB according to claim 1, further comprising:
   two heat dissipation foot, each heat dissipation foot comprising a support portion for supporting the light emitting body, an engaging portion and a connecting portion for connecting the support portion to the engaging portion; and
   two third recess portions on the PCB body for receiving the engaging portions of the heat dissipation feet to increase heat dissipation of the heat dissipation feet.

6. The PCB according to claim 5, wherein a height of the heat sink is larger than a height of a connecting portion and the bottom surface of the heat sink is coplanar with a surface of the PCB body on which the LED element is mounted.

7. The PCB according to claim 5, wherein the third recess portion is a through hole or a blind hole.

8. A printed circuit board (PCB) comprising
   at least one light emitting diode (LED) element comprising a heat sink, a light emitting body and at least one foot comprising a support portion for supporting the light emitting body, an engaging portion and a connecting portion for connecting the support portion to the engaging portion, wherein the heat sink is disposed under the support portion; and
   a PCB body comprising a first recess portion for disposing the heat sink to increase heat dissipation of the heat sink and at least one second recess portion for receiving the engaging portion of the at least one foot to increase heat dissipation of the at least one foot.

9. The PCB according to claim 8, wherein a height of the heat sink is larger than a height of a connecting portion and the bottom surface of the heat sink is coplanar with a surface of the PCB body on which the LED element is mounted.

10. The PCB according to claim 8, wherein the first recess portion is a through hole or a blind hole.

11. The PCB according to claim 8, wherein the second recess portion is a through hole or a blind hole.

\* \* \* \* \*